United States Patent
Shor et al.

(10) Patent No.: US 8,971,218 B2
(45) Date of Patent: Mar. 3, 2015

(54) SYSTEM AND METHOD FOR PROGRAMMABLE MATCHING OF DETUNED RF COMPONENTS

(71) Applicants: Arie Shor, Sunnyvale, CA (US); Michael Richard Green, Needham, MA (US)

(72) Inventors: Arie Shor, Sunnyvale, CA (US); Michael Richard Green, Needham, MA (US)

(73) Assignee: Qualcomm Incorporated, San Diego, CA (US)

( * ) Notice: Subject to any disclaimer, the term of this patent is extended or adjusted under 35 U.S.C. 154(b) by 82 days.

(21) Appl. No.: 13/623,816

(22) Filed: Sep. 20, 2012

(65) Prior Publication Data

US 2014/0078914 A1    Mar. 20, 2014

(51) Int. Cl.
   *H04L 5/14*    (2006.01)
(52) U.S. Cl.
   USPC ........................................................ 370/276
(58) Field of Classification Search
   USPC .......... 370/252, 276–279, 282, 297; 343/745; 455/77, 120, 178.1, 187.1, 191.1, 455/193.1
   See application file for complete search history.

(56) References Cited

U.S. PATENT DOCUMENTS

| | | | |
|---|---|---|---|
| 4,380,767 A * | 4/1983 | Goldstein et al. | 343/745 |
| 4,564,843 A * | 1/1986 | Cooper | 343/745 |
| 4,806,944 A * | 2/1989 | Jacomb-Hood | 343/745 |
| 7,482,887 B2 | 1/2009 | Cyr et al. | |
| 7,864,133 B2 | 1/2011 | Rofougaran | |
| 7,865,154 B2 | 1/2011 | Mendolia et al. | |
| 8,131,232 B2 | 3/2012 | Muhammad | |
| 8,188,904 B2 | 5/2012 | Grebennikov et al. | |
| 2008/0305749 A1 * | 12/2008 | Ben-Bassat | 455/77 |
| 2014/0022132 A1 * | 1/2014 | Badaruzzaman et al. | 343/745 |

OTHER PUBLICATIONS

Firrao et al, An Automatic Antenna Tuning System Using Only RF Signal Amplitudes, IEEE, 5 pages, Sep. 2008.*

* cited by examiner

*Primary Examiner* — Frank Duong
(74) *Attorney, Agent, or Firm* — Bay Area Technology Law Group PC (57) ABSTRACT

Systems and methods are disclosed for returning RF components which exhibit a mismatch with a coupled load. A tuning circuit may be coupled to a signal path of the RF component, wherein the tuning circuit includes a plurality of loads, a switching element associated with each load, wherein each switching element brings the associated load into and out of the signal path, a control line for each switching element, and a phase stage configured to introduce a phase shift, such as 90°, between a first subset of the loads and a second subset of the loads. The disclosure also includes routines for establishing optimum settings for the tuning circuit.

11 Claims, 4 Drawing Sheets

SYSTEM AND METHOD FOR PROGRAMMABLE MATCHING OF DETUNED RF COMPONENTS

FIELD OF THE PRESENT INVENTION

This disclosure is directed to a circuit for retuning RF components which exhibit a mismatch with a coupled load due to proximity, tolerance or any other effect which may cause detuning. In particular, this disclosure is directed to programmed tuning of an antenna detuned by proximity to other objects.

BACKGROUND OF THE INVENTION

To facilitate the design and manufacturing process, it may be desirable to employ a modular architecture in which various components are implemented as discrete devices that may be incorporated into an overall system. For example, separate radio frequency (RF) components such as wireless local area network (WLAN) modules, Bluetooth modules, telecommunication network modules and modules for other radio access technologies (RATs) may be provided as separate integrated circuits (ICs) or other packages which are then attached to a motherboard. In particular, it may be desirable to design such RF components so that they may be soldered onto the motherboard to reduce cost and size. In such designs, the antenna may be integrated into the motherboard or a connection to separate antenna element(s) may be provided via the motherboard, so that the associated RF component may be coupled to the antenna.

As will be appreciated, the impedance of an RF component is preferably matched to its associated antenna to provide efficient operation. Typically, a dedicated antenna tuning circuit may be employed to achieve the desired control impedance to match the RF component to the antenna. While a fixed tuning circuit may be included in the RF component to provide a specified impedance, the design of the motherboard and the associated antenna elements may require an additional antenna tuning circuit on the host motherboard to achieve an adequate match between the RF component and the antenna element on the host motherboard. In particular, solder-down implementations may involve deviations relative to the designed impedance due to the soldered connection to the antenna and manufacturing variances, including the stack up of the motherboard and antenna trace width and length discrepancies. Accordingly, to minimize impedance mismatch, it may be necessary to customize an additional antenna tuning circuit on the motherboard. As will be appreciated, this represents a significant cost and complication in the manufacturing process.

Accordingly, it would be desirable to provide a tuning circuit configured to correct mismatches due to manufacturing variances. It would also be desirable to provide a tuning circuit that facilitates regulatory compliance. This invention accomplishes these and other goals.

SUMMARY OF THE INVENTION

In accordance with the above needs and those that will be mentioned and will become apparent below, this specification discloses a tuning circuit for matching the impedance of a radio frequency signal having a first transmit frequency, including a signal path, a plurality of loads, a switching element associated with each load, wherein each switching element brings the associated load into and out of the signal path, a control line for each switching element, and a phase stage configured to introduce a phase shift between a first subset of the loads and a second subset of the loads. In some embodiments, the phase shift may be 90°. Further, each load may be an inductor and capacitor combination.

In one embodiment, the tuning circuit also includes a control module configured to store programming information for the tuning circuit and to supply associated signals to the control lines to operate the switching elements.

In another embodiment, the phase stage may be a transmission line having a length corresponding to one quarter of the wavelength of the first transmit frequency. Alternatively, the phase stage may be discrete inductor and capacitor components. Further, the switching elements may be PIN diodes. In such embodiments, the first subset of the loads may be switched by a first PIN diode pair and the second subset of the loads may be switched by a second PIN diode pair, such that the first and second PIN diode pairs are separated by the phase stage.

This disclosure is also directed to a method for matching the impedance of a radio frequency signal having a first transmit frequency, including providing a tuning circuit coupled to a signal path, the tuning circuit including a plurality of loads, a switching element associated with each load, a control line associated with each switching element and a phase stage configured to introduce a phase shift between a first subset of the loads and a second subset of the loads and operating one of the switching elements to brings the associated load into the signal path. In one embodiment, the phase shift may be 90°. Further, each load may be an inductor and capacitor combination.

In one embodiment, the method also includes providing a control module, storing programming information for the tuning circuit in the control module and using the control module to supply a signal to the control line to operate the switching element.

In one embodiment, the phase stage comprises a transmission line having a length corresponding to one quarter of the wavelength of the first transmit frequency. Alternatively, the phase stage may be discrete inductor and capacitor components. Further, the switching elements may be PIN diodes. In such embodiments, the first subset of the loads may be switched by a first PIN diode pair and the second subset of the loads may be switched by a second PIN diode pair, such that the first and second PIN diode pairs are separated by the phase stage.

In another aspect, the disclosure includes a method for programming a radio module including the steps of providing a tuning circuit coupled to a signal path of the radio module, the tuning circuit including a plurality of loads, a switching element associated with each load, a control line associated with each switching element and a phase stage configured to introduce a 90° phase shift between a first subset of the loads and a second subset of the loads, wherein the tuning circuit has a plurality of discrete settings associated with selective operation of the switching elements, measuring transmit power of the radio module at each of the plurality of discrete settings, and determining an optimum setting corresponding to the discrete setting associated with maximized transmit power.

In one embodiment, the method may also include performing an error measurement at each of the plurality of discrete settings and wherein determining the optimum setting further comprises verifying the error measurement does not exceed a threshold. The error measurement may include measuring packet error rate (PER), error vector matrix (EVM) and IEEE mask characteristics.

In one embodiment, the method may also include storing programming information corresponding to the optimum setting in a control module configured to supply signals to the control lines to operate the switching elements.

In one embodiment, the method may also include establishing regulatory compliance for each of the plurality of discrete settings.

Another aspect of the disclosure is directed to a processor-readable medium for programming a radio module having a tuning circuit with a plurality of discrete settings for correcting impedance mismatches, wherein the medium is encoded with instructions for measuring the transmit power of the radio module at each of the plurality of discrete settings and determining an optimum setting corresponding to the discrete setting associated with maximized transmit power.

In one embodiment, the processor-readable medium may also include instructions for performing an error measurement at each of the plurality of discrete settings and wherein the instructions for determining the optimum setting further comprise instructions for verifying the error measurement does not exceed a threshold. For example, the instructions for performing an error measurement may include instructions for measuring packet error rate (PER), error vector matrix (EVM) and IEEE mask characteristics.

Further, the processor-readable medium may also include instructions for storing programming information corresponding to the optimum setting in a control module configured to supply signals to operate the tuning circuit one of the discrete settings.

BRIEF DESCRIPTION OF THE DRAWINGS

Further features and advantages will become apparent from the following and more particular description of the preferred embodiments of the invention, as illustrated in the accompanying drawings, and in which like referenced characters generally refer to the same parts or elements throughout the views, and in which.

DETAILED DESCRIPTION OF THE INVENTION

At the outset, it is to be understood that this disclosure is not limited to particularly exemplified materials, architectures, routines, methods or structures as such may, of course, vary. Thus, although a number of such options, similar or equivalent to those described herein, can be used in the practice or embodiments of this disclosure, the preferred materials and methods are described herein.

It is also to be understood that the terminology used herein is for the purpose of describing particular embodiments of this disclosure only and is not intended to be limiting.

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, may refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

As such, techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a tangible processor-readable storage medium comprising instructions that, when executed, performs one or more of the methods described above. The tangible processor-readable data storage medium may form part of a computer program product, which may include packaging materials. Accordingly, embodiments described herein may be discussed in the general context of processor-executable instructions residing on some form of processor-readable medium, such as program modules, executed by one or more computers or other devices. Generally, program modules include routines, programs, objects, components, data structures, etc., that perform particular tasks or implement particular abstract data types. The functionality of the program modules may be combined or distributed as desired in various embodiments.

By way of example, and not limitation, the tangible processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a processor-readable communication medium that carries or communicates code in the form of instructions or data structures and that can be accessed, read, and/or executed by a computer.

The instructions may be executed by one or more processors, such as one or more digital signal processors (DSPs), general purpose microprocessors, application specific integrated circuits (ASICs), application specific instruction set processors (ASIPs), field programmable gate arrays (FP- GAs), or other equivalent integrated or discrete logic circuitry. The term "processor," as used herein may refer to any of the foregoing structure or any other structure suitable for implementation of the techniques described herein. In addition, in some aspects, the functionality described herein may be provided within dedicated software modules or hardware modules configured as described herein. Also, the techniques could be fully implemented in one or more circuits or logic elements.

In the figures, a single block may be described as performing a function or functions; however, in actual practice, the function or functions performed by that block may be performed in a single component or across multiple components, and/or may be performed using hardware, using software, or using a combination of hardware and software. Also, the exemplary radio modules, RF components, and end products may include components other than those shown, including well-known components such as a processor, memory and the like.

For purposes of convenience and clarity only, directional terms, such as top, bottom, left, right, up, down, over, above, below, beneath, rear, back, and front, may be used with respect to the accompanying drawings or particular embodiments. These and similar directional terms should not be construed to limit the scope of the invention in any manner and may change depending upon context. Further, sequential terms such as first and second may be used to distinguish similar elements, but may be used in other orders or may change also depending upon context.

Unless defined otherwise, all technical and scientific terms used herein have the same meaning as commonly understood by one having ordinary skill in the art to which the disclosure pertains.

Finally, as used in this specification and the appended claims, the singular forms "a," "an" and "the" include plural referents unless the content clearly dictates otherwise.

As will be discussed in detail below, this disclosure is directed to providing programmable impedance matching using a circuit in an RF signal path having a plurality of loads, a switching element associated with each load, a control line for each load configured to activate the switching elements individually and bring the loads into and out of the signal path, and a phase stage configured to introduce a phase shift, such as 90°, between a first subset of the plurality of loads and a second subset of the plurality of loads. Although the primary embodiments that will be discussed involve impedance matching a WLAN radio module to an antenna, the techniques may be extended to any suitable application having an RF component and another coupled load.

In the context of the primary embodiments, various wireless communication devices may use radios coupled to antennas designed to operate at one or more desired frequencies. Impedance matching optimizes the transmission and reception radiation performance of the antenna. As is known in the art, the impedance of an RF component may be adjusted by varying a load applied to the signal path such as by incorporating suitable reactive elements, including capacitors and inductors. As noted above, a tuning circuit may be integrated into the RF component to provide a designed impedance. However, due to manufacturing variations, undesirable impedance mismatch may exist after the RF component is installed, particularly in the context of solder-down applications.

Conventionally, the resulting impedance mismatch is corrected using a separate circuit on the motherboard that is custom tuned. Accordingly, to implement a discrete radio module in this manner may require significant RF expertise, development time and lab resources. Further, regulatory compliance is an important aspect of any wireless communication technology. One of the primary benefits represented by the modular design of an RF component is the ability to certify operation of the module, obviating the need for additional testing for end products utilizing the module provided its characteristics are not modified. However, the use of a supplemental tuning circuit on the motherboard may require recertification of the module which is costly and time consuming.

Thus, the programmable tuning circuits of this disclosure are preferably configured to provide sufficient range of adjustment to correct for impedance mismatches associated with manufacturing variations. Additionally, the tuning circuits may be configured to provide a defined number of impedance settings, each of which may be subjected to regulatory testing. As a result, an RF component featuring the tuning circuit may be incorporated into an end product and one of the impedance settings may be employed to offset any impedance mismatch resulting from the manufacturing process. Since compliance has been established for each of the impedance settings, additional regulatory testing may not be necessary.

Figure 1:
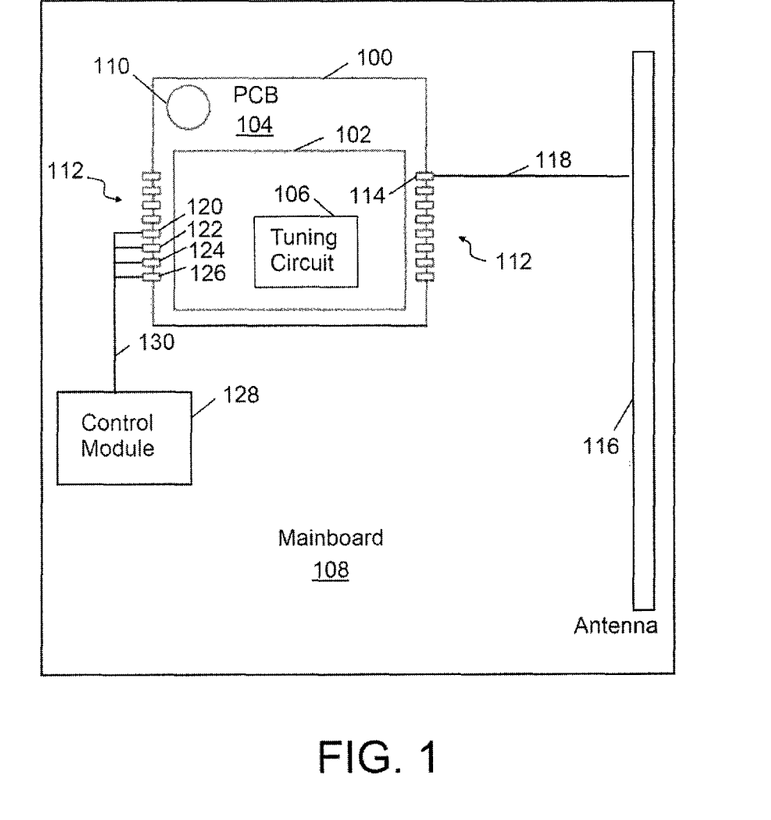
FIG. 1 depicts a radio module configured for a solder-down application having a tuning circuit, according to one embodiment.

As shown in FIG. 1, an RF component such as WLAN radio module 100 may be provided as a discrete component having one or more ICs 102 carried by printed circuit board (PCB) 104. In this embodiment, IC 102 includes programmable tuning circuit 106. WLAN radio module 100 is configured to be mounted to host mainboard 108 in a suitable manner, such as by mounting hole 110. As WLAN radio module 100 is configured for use in solder-down applications, a plurality of pins 112 are provided that may be soldered to corresponding pads (not shown for clarity) on mainboard 108 to implement the desired electrical connections. Of particular relevance to this disclosure, WLAN radio module 100 may specifically include RF pin 114 for coupling to antenna element 116 integrated onto host mainboard 108 via trace 118 and a plurality of general purpose in/out (GPIO) pins 120, 122, 124 and 126 for accepting control signals to program the tuning circuit 106. A control module 128 implemented on circuit board 108 as shown, or provided in another module coupled to circuit board 108, may be configured to store programming information for WLAN radio module 100 and to supply the appropriate control signals to pins 120, 122, 124 and 126 via traces 130. In some embodiments, control module 128 may be a functional block of a host processor (not shown).

Figure 2:
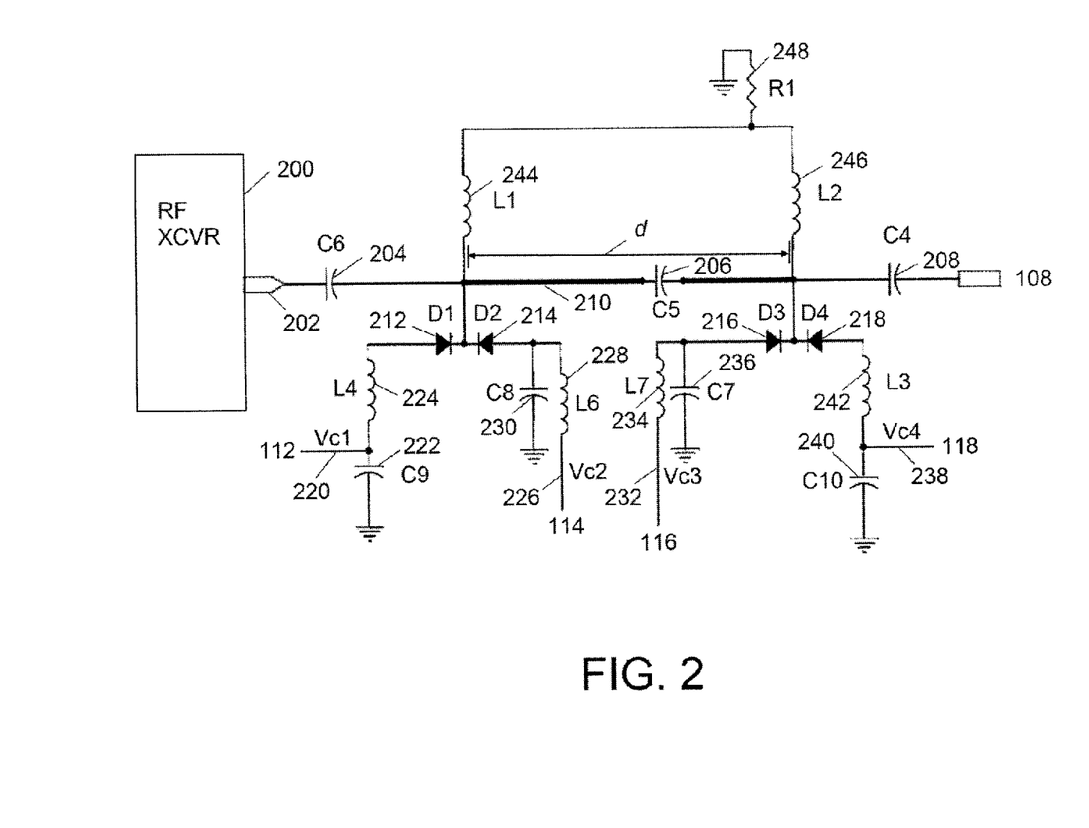
FIG. 2 depicts a circuit schematic of a programmable tuning circuit, according to one embodiment.

One embodiment of a suitable tuning circuit 106 is schematically shown in FIG. 2. WLAN radio module 100 includes RF transceiver (RF XCVR) 200 with a signal line 202 that feeds through DC blocking capacitors 204, 206 and 208 and wavelength transmission line 210. As shown, four switching elements, PIN diodes 212, 214, 216 and 218 organized as diode-pairs, allow loads formed by capacitor and inductor combinations to be switched into to the signal path. As desired, other suitable switching elements may be employed. In particular, control line Vc1 220 may be used to deliver a signal received at pin 120 to the junction of series connected capacitor 222 and inductor 224, control line Vc2 226 may be used to deliver a signal received at pin 122 to inductor 228 and parallel connected capacitor 230, control line Vc3 232 may be used to deliver a signal received at pin 124 to inductor 234 and parallel connected capacitor 236, and control line Vc4 238 may be used to deliver a signal received at pin 126 to the junction of series connected capacitor 240 and inductor 242. By applying a control signal, such as positive supply voltage, to the control lines, the associated PIN diode is forward biased and short circuits to couple the capacitor inductor pair to the signal path. For example, applying voltage to Vc1 220 forward biases PIN diode 212 to couple capacitor 222 and inductor 224. Likewise, forward biasing PIN diode 214 couples inductor 228 and capacitor 230, forward biasing PIN diode 216 couples inductor 234 and capacitor 236, and forward biasing PIN diode 218 couples capacitor 240 and inductor 242. A T network formed by inductors 244 and 246 and resistor 248 functions as an RF choke.

With suitable selected components, only one load line formed by an inductor and capacitor may consume current. As a result, five primary tuning settings are possible in this embodiment, one for no correction and one corresponding to the activation of each PIN diode. Additional settings may be obtained by activating a control line from each of the first and second subsets of inductor-capacitor loads to simultaneously couple two inductor and capacitor loads. In other embodiments, different numbers of switching elements and associated loads may be employed to provide a desired number of combinations.

In this design, subsets of the inductor and capacitor loads are separated by a phase stage formed by wavelength transmission line 210. In one embodiment, the length d of transmission line 210 is sized to correspond to one-quarter of the wavelength of the intended operating frequency ($\lambda/4$) of RF XCVR 200. As will be appreciated, this configuration may be used to create a phase delay between a first subset of inductor-capacitor loads, switched by the diode-pair formed by PIN diodes 212 and 214, and a second subset of inductor-capacitor loads, switched by the diode-pair formed by PIN diodes 216 and 218. By using a length d for transmission line 210 that corresponds to one-quarter of the wavelength, a phase shift of 90° may be imparted between the two subsets of loads.

In other embodiments, the tuning circuit may be extended by adding one or more diode-pairs configured to allow additional subsets of inductor-capacitor loads to be switched into the circuit. As will be appreciated, each diode-pair may be separated by a transmission line configured to impart a desired phase shift between the subsets of inductor-capacitor loads. For example, in another embodiment three diode-pairs may be employed in series, such that the two end pairs are spaced from the middle pair by transmission lines having a length d corresponding to one-eighth of the wavelength to impart a phase shift of 45° between the diode-pairs. Similarly, other numbers of diode-pairs spaced by suitable phase shift stages may be employed as desired.

Figure 3:
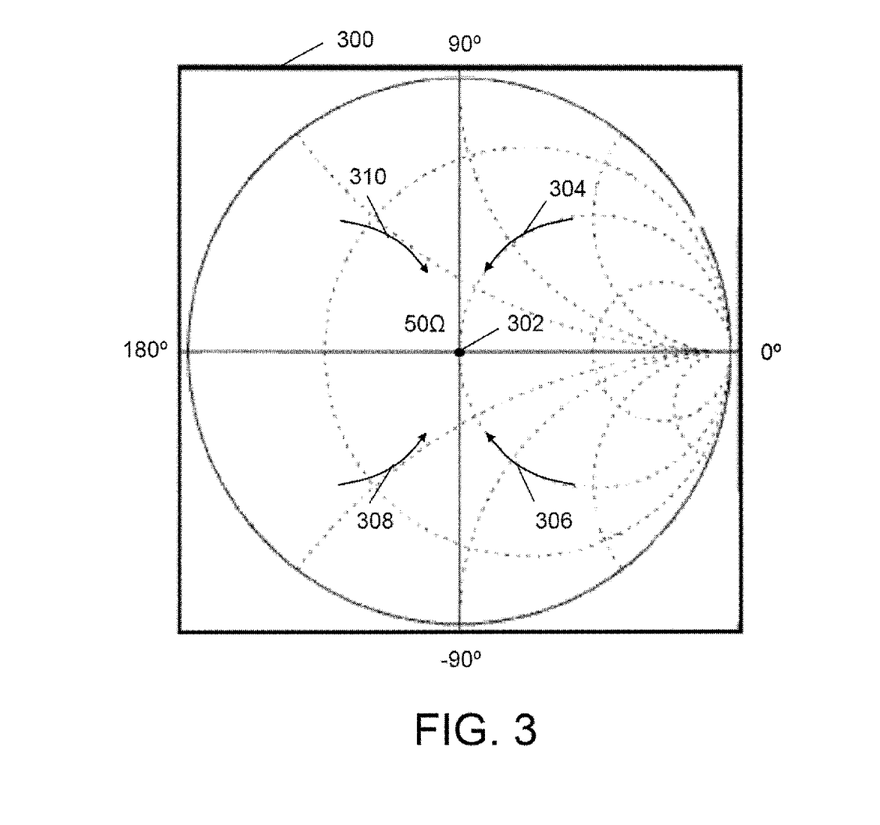
FIG. 3 is a representation of a Smith Chart showing corrections to impedance mismatches using a programmable tuning circuit, according to one embodiment.

A benefit associated with the use of $\lambda/4$ transmission line 210 is depicted graphically with respect to the Smith Chart shown in FIG. 3. As known to those of skill in the art, a Smith chart is a plot of the complex reflection coefficient that may be used to assess the effect changing inductance and capacitance. A Smith Chart may be impedance normalized so that the center of the chart represents the ideal impedance that optimizes performance of the antenna, such as 50Ω. Thus, as shown in FIG. 3, Smith Chart 300 may be divided into quadrants formed by the intersecting lines drawn between 0° and 180° and between 90° and −90°. The degree of impedance matching may be expressed by the voltage standing wave ratio (VSWR), which is computed as one plus the reflection coefficient divided by one minus the reflection coefficient. When the impedance is matched, the reflection coefficient is zero, meaning that no signal is reflected by the antenna and all signal is transmitted, as represented by center point 302. Impedance mismatches, as represented by points in one of the quadrants of Smith Chart 300, may be corrected by varying the inductance or capacitance as indicated to rotate towards center point 302. Accordingly, the four loads formed by the inductor and capacitor pairs and the 90° phase shift may be configured to provide a suitable correction for mismatches occurring in each quadrant. For example, the load switched by PIN diode 212 may operate to provide a correction as indicated by line 308. Similarly, PIN diode 214 may provide a correction along line 310, PIN diode 216 may provide a correction along line 304, and PIN diode 218 may provide a correction along line 306.

Thus, in implementations involving moderate mismatches, a single control line may be used to activate the corresponding load to provide the correction. These corrections may be configured to account for the variances associated with a solder-down application or other anticipated manufacturing variances. In situations requiring more extreme retuning, a second control line belonging to the other subset of loads may be used to provide further correction. Further, as discussed above, embodiments of this disclosure may feature a tuning circuit having additional subsets of inductor-capacitor loads that are switched into the circuit through corresponding diode-pairs. By providing more combinations of loads, a greater number of corrections may be provided. For example, in some embodiments, eight or another suitable number of corrections may be implemented rather than the four shown in FIG. 3. Preferably, the corrections may be spaced substantially evenly around the Smith Chart to address the essentially random nature of impedance mismatches resulting from manufacturing variances and similar causes.

Figure 4:
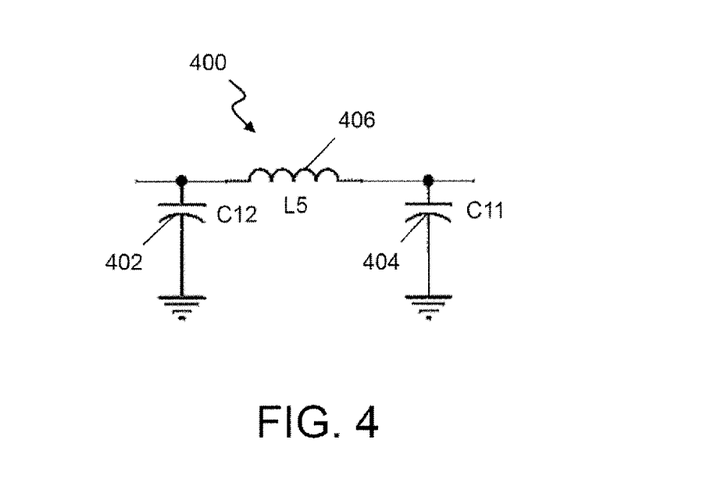
FIG. 4 depicts a circuit schematic of a phase stage employing discrete components, according to one embodiment.

As described above, transmission line 210 preferably has length d that may be determined as a function based upon the speed of light divided by the frequency to which the circuit applies. For example, in 2.4 GHz WLAN and Bluetooth applications, the wavelength is approximately 60 mm leading to a one-quarter transmission line length of approximately 15 mm in order to impart a 90° phase shift. Other transmission line lengths may be used to impart different phase shifts as desired. Thus, transmission line 210 may be implemented as a trace or other suitable element while maintaining an overall compact size for WLAN radio module 100. Alternatively, transmission line 210 may be replaced by a suitable combination of discrete components configured to reproduce the desired phase shift. One embodiment is shown in FIG. 4 which features phase stage 400 including two capacitor legs, capacitors 402 and 404, and an inductor bridge, inductor 406, in a π (pi) network. The use of components to generate the phase shift may be desirable when the target frequency would involve the use of transmission line 210 having a length exceeding the practical distance available given the package size of the RF component.

Thus, the techniques of this disclosure are directed to providing a programmable tuning circuit having a plurality of discrete settings corresponding to separate fixed loads that may be selected to provide an appropriate matching of the radio module to the antenna once the radio module is properly installed. Further, since only a fixed number of tuning options are possible, each combination may be tested for conformance with any applicable regulations. Thus, once regulatory testing is passed for each combination, the radio module may be incorporated into a wireless device without the need to undergo further conformance testing. By limiting the number of possible combinations, conformance testing may be achieved as a practical matter.

Likewise, since a limited number of combinations are available, the appropriate selection may be easily programmed by simply testing a suitable performance metric at each available setting. For example, the transmit power at each setting may be assessed to determine the correct setting as transmit power may vary inversely with impedance mismatch. Preferably, additional criteria may be used to help confirm the appropriate setting including the use of packet error rate (PER), error vector matrix (EVM) and IEEE mask measurements.

In particular, integration of a radio module with the programmable tuning circuit into an end product may involve a pilot testing process. For example, a test end product incorporating the radio module may be used to validate a production line for given combinations of the radio module and antenna. As noted, each possible impedance setting may have already been tested for regulatory compliance so that additional conformance testing is not required. Similarly, dedicated RF analysis may also be unnecessary as the correct setting may be readily determined using the procedures of this disclosure. The typical requirement for RF engineers to test and evaluate antenna matching and VSWR characteristics of the system or the selection of suitable matching components are also avoided by following the techniques of this disclosure. In short, no additional resources in the production facility beyond typical test equipment are mandated.

Suitable testing procedures may be implemented to evaluate device performance and calibration for each tuning settings over various transmit frequencies and modulations. In general, these techniques may be substituted for direct measurement of antenna matching and VSWR of the end product. As will be appreciated, either conducted or radiated production line testing may be used. A conducted method may be preferable for end products using externally connected matched 50Ω antennas, such as planar inverted-F antennas (PIFAs) where the antenna connector is available on the host mainboard. Radiated testing may be preferable for end products without an antenna connector using an integrated antenna (circuit board trace or chip) and may be performed in a shielded room.

Figure 5:
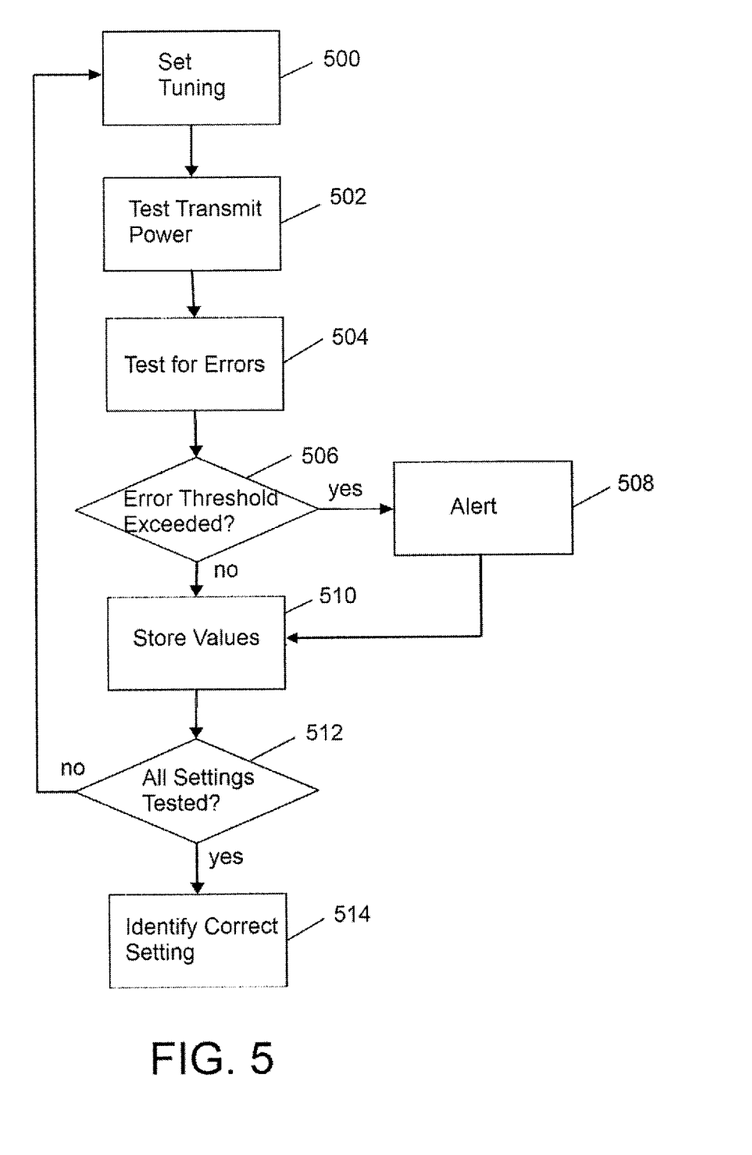
FIG. 5 is a flowchart of a routine for programming a tuning circuit to correct for impedance mismatches, according to one embodiment.

One exemplary routine for programming the tuning circuit is represented by the flowchart depicted in FIG. 5. The routine may be implemented in software as desired and performed manually or automatically, so the following procedures may be conducted by an operator or by suitably-configured automated test equipment as desired. The routine may be used to determine the optimal tuning impedance setting using an algorithm based on the maximum achievable transmit power expected to yield best overall product performance while checking for errors associated with unexpected or inadequate behavior. As shown, the routine begins at step 500 by configuring the radio module with the first tuning setting. In step 502, the transmit power for the established tuning setting is measured. Transmit power tests may be done with a single target transmit power, in order to determine the impact of the tuning setting on actual transmit power performance. Then, in step 504, PER/EVM and IEEE mask error tests may be performed. If variance beyond a designated threshold is determined in step 506, an alert may be generated in step 508, and indicated visually, audibly, or logged. Preferably, steps 502 and 504 are conducted for low, medium and high WLAN sub-bands, such as 2.401-2.423 GHz, 2.426-2.448 GHz, and 2.451-2.473 GHz, corresponding to channels 1, 6 and 11 for 2.4 GHz WLAN applications, or 5.150-5.250 GHz, 5.250-5.350 GHz and 5.725 to 5.825 GHz for 5 GHz WLAN applications, and with a low (<24 Mbps) and high (>24 Mbps) data rates. Further, temperature and supply voltages may be kept constant during the comparison tests.

The measured values associated with the tuning setting are then recorded in step 510. In step 512, a check is performed to determine if all possible settings have been tested. If not, the routine returns to step 500 and the next tuning setting is selected. Otherwise, step 514 determines the correct programming for the radio module so that the source data and selected tuning value may be recorded. The proper tuning setting may be selected by identifying the setting corresponding to the highest effective transmit power, since tuning settings that result in a mismatch between the radio module and the antenna will exhibit a degraded VSWR and return loss, and therefore reduced effective transmit power. In one aspect, the selected tuning value may be stored in a non-volatile memory location in the radio module under test. Accordingly, during volume production of the end product, the tuning value determined using this routine may be used to program the tuning circuit of the radio module.

Described herein are representative embodiments. However, one skilled in the art that pertains to the present invention will understand that the principles of this disclosure can be extended easily with appropriate modifications to other applications.

What is claimed is:

1. A tuning circuit for matching an impedance of a radio frequency signal having a first transmit frequency, comprising:
   a signal path;
   a plurality of loads;
   a switching element associated with each load, wherein each switching element brings the associated load into and out of the signal path and wherein the tuning circuit has a plurality of discrete settings associated with selective operation of the switching elements;
   a control line for each switching element;
   a phase stage to introduce a phase shift between a first subset of the loads and a second subset of the loads; and
   a control module to:
      measure transmit power of the radio module at each of the plurality of discrete settings;
      determine an optimum setting corresponding to the discrete setting associated with maximized transmit power; and
      perform an error measurement at each of the plurality of discrete settings, wherein determining the optimum setting further comprises verifying the error measurement does not exceed a threshold.

2. The tuning circuit of claim 1, wherein the error measurement is selected from the group consisting of packet error rate (PER), error vector matrix (EVM) and IEEE mask characteristics.

3. The tuning circuit of claim 1, wherein the control module further to store programming information corresponding to the optimum setting.

4. The tuning circuit of claim 1, wherein the control module further to establish regulatory compliance for each of the plurality of discrete settings.

5. A method for programming a radio module comprising:
   providing a tuning circuit coupled to a signal path of the radio module, the tuning circuit including a plurality of loads, a switching element associated with each load, a control line associated with each switching element and a phase stage configured to introduce a phase shift between a first subset of the loads and a second subset of the loads, wherein the tuning circuit has a plurality of discrete settings associated with selective operation of the switching elements;
   measuring transmit power of the radio module at each of the plurality of discrete settings;
   determining an optimum setting corresponding to the discrete setting associated with maximized transmit power; and
   performing an error measurement at each of the plurality of discrete settings, wherein determining the optimum setting further comprises verifying the error measurement does not exceed a threshold.

6. The method of claim 5, wherein the error measurement is selected from the group consisting of packet error rate (PER), error vector matrix (EVM) and IEEE mask characteristics.

7. The method of claim 5, further comprising storing programming information corresponding to the optimum setting in a control module configured to supply signals to the control lines to operate the switching elements.

8. The method of claim 5, further comprising establishing regulatory compliance for each of the plurality of discrete settings.

9. A processor-readable non-transitory medium for programming a radio module having a tuning circuit with a plurality of discrete settings for correcting impedance mismatches, wherein the medium is encoded with instructions for measuring the transmit power of the radio module at each of the plurality of discrete settings and determining an optimum setting corresponding to the discrete setting associated with maximized transmit power and instructions for performing an error measurement at each of the plurality of discrete settings and wherein the instructions for determining the optimum setting further comprise instructions for verifying the error measurement does not exceed a threshold.

10. The processor-readable medium of claim 9, wherein the error measurement is selected from the group consisting of packet error rate (PER), error vector matrix (EVM) and IEEE mask characteristics.

11. The processor-readable medium of claim 9, further comprising instructions for storing programming information corresponding to the optimum setting in a control module configured to supply signals to operate the tuning circuit at one of the discrete settings.

\* \* \* \* \*